(12) United States Patent
Thean et al.

(10) Patent No.: US 7,659,156 B2
(45) Date of Patent: Feb. 9, 2010

(54) METHOD TO SELECTIVELY MODULATE GATE WORK FUNCTION THROUGH SELECTIVE GE CONDENSATION AND HIGH-K DIELECTRIC LAYER

(75) Inventors: Voon-Yew Thean, Austin, TX (US); Marc Rossow, Austin, TX (US); Gregory S. Spencer, Pflugerville, TX (US); Tab A. Stephens, Buda, TX (US); Dina H. Triyoso, Austin, TX (US); Victor H. Vartanian, Dripping Springs, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 287 days.

(21) Appl. No.: 11/788,216

(22) Filed: Apr. 18, 2007

(65) Prior Publication Data

US 2008/0258219 A1    Oct. 23, 2008

(51) Int. Cl.
H01L 21/336    (2006.01)
(52) U.S. Cl. .................. 438/197; 257/E21.32
(58) Field of Classification Search ........... 438/197, 438/199, 216, 287, 275; 257/406, 410, 411, 257/412, E21.32, E21.561
See application file for complete search history.

(56) References Cited

U.S. PATENT DOCUMENTS 6,475,869 B1 * 11/2002 Yu ............................. 438/303
6,713,846 B1 * 3/2004 Senzaki ....................... 257/635
7,084,423 B2    8/2006 Grupp et al.
2004/0026687 A1    2/2004 Grupp et al.
2005/0093027 A1    5/2005 Grupp et al.
2005/0247956 A1    11/2005 Grupp et al.
2007/0099361 A1 * 5/2007 Thean et al. ................ 438/197

OTHER PUBLICATIONS

Shimamoto, Y. et al., "Advantages of gate work-function engineering by incorporating sub-monolayer Hf at SiON/poly-Si interface in low-power CMOS".
Hobbs, C. et al., "Fermi Level Pinning at the PolySi/Metal Oxide Interface"; 2003 Symposium on VLSI Technology Digest of Technical Papers; 2 pages.
Hoon, Jung O., "GaAs Heteroepitaxy on SiGe-on-Insulator Using Ge Condensation and Migration Enhanced Epitaxy"; Dept. of Elec. & Comp. Eng., Natl Univ. of Singapore.

* cited by examiner

Primary Examiner—Thao P. Le
(74) Attorney, Agent, or Firm—John A. Fortkort; Fortkort & Houston P.C.

(57) ABSTRACT

A semiconductor device is provided which comprises a semiconductor layer (109), a dielectric layer (111), first and second gate electrodes (129, 131) having first and second respective work functions associated therewith, and a layer of hafnium oxide (113) disposed between said dielectric layer and said first and second gate electrodes.

19 Claims, 6 Drawing Sheets

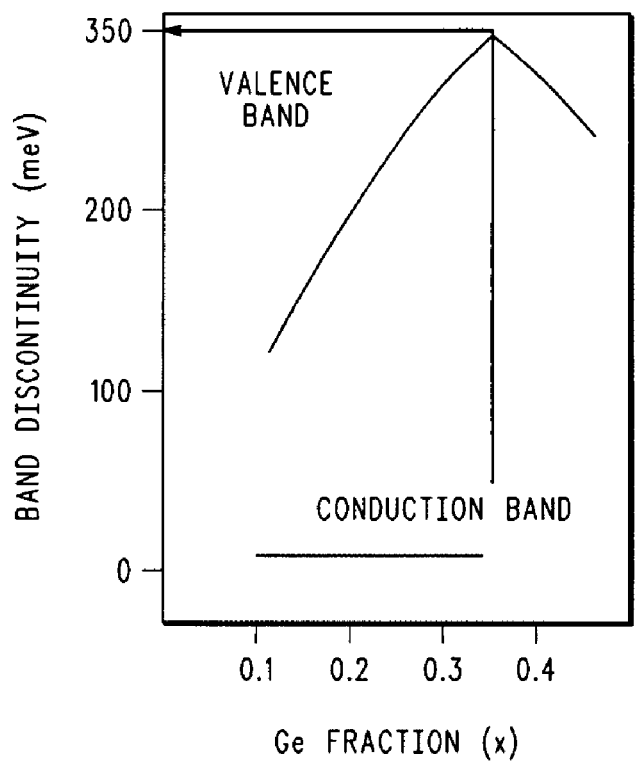
FIG. 14
FIG. 15
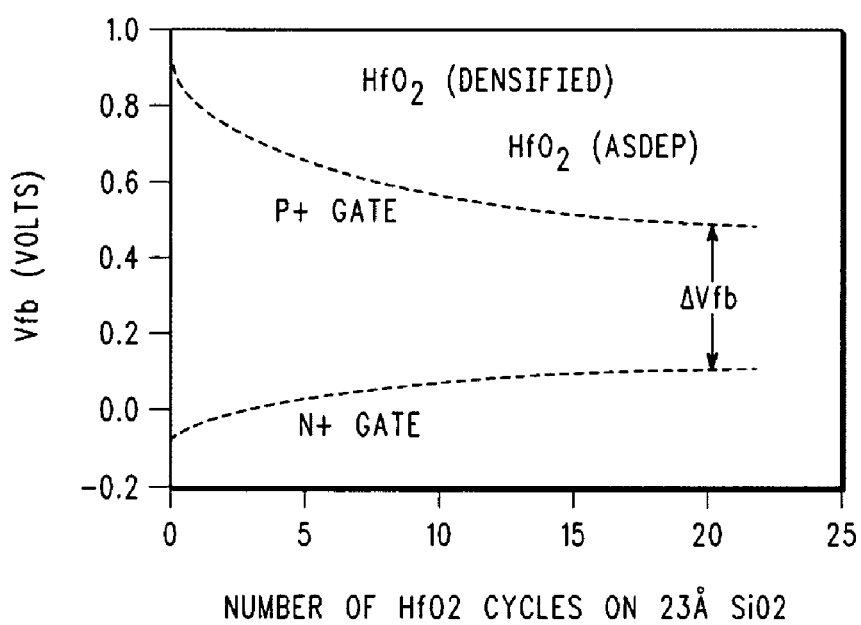

METHOD TO SELECTIVELY MODULATE GATE WORK FUNCTION THROUGH SELECTIVE GE CONDENSATION AND HIGH-K DIELECTRIC LAYER

FIELD OF THE DISCLOSURE

The present invention relates generally to fabrication processes for semiconductor devices, and more particularly to methods for modulating the gate work function of semiconductor devices through selective germanium condensation and the use of a high-K dielectric layer.

BACKGROUND OF THE DISCLOSURE

Semiconductor-On-Insulator (SOI) wafers, which may be formed from a handle wafer and a donor wafer, have received considerable interest in the art, due to the advantageous properties arising from the presence of a dielectric layer disposed beneath the device layer in these structures. In many applications, as in the fabrication of MOSFETs, the use of SOI wafers offers several advantageous properties in the resulting device, such as reduced leakage currents and lower capacitance.

The properties of devices fabricated on SOI wafers may be further enhanced by the application of strain across the device layer or portions thereof. For example, in MOSFET devices built on SOI wafers, the application of tensile strain across the channel layer of these devices is found to enhance carrier mobility in the PMOS regions of the device. Hence, strained SOI structures (often referred to as SSOI structures) combine the benefits of SOI technology with those of strained semiconductor technology.

BRIEF DESCRIPTION OF THE DRAWINGS

FIG. 14 is a graph of band discontinuity (in meV) as a function of Ge fraction; and FIG. 15 is a graph of flat band voltage ($V_{FB}$) as a function of HfO$_2$ cycles.

DETAILED DESCRIPTION

Figure 1:
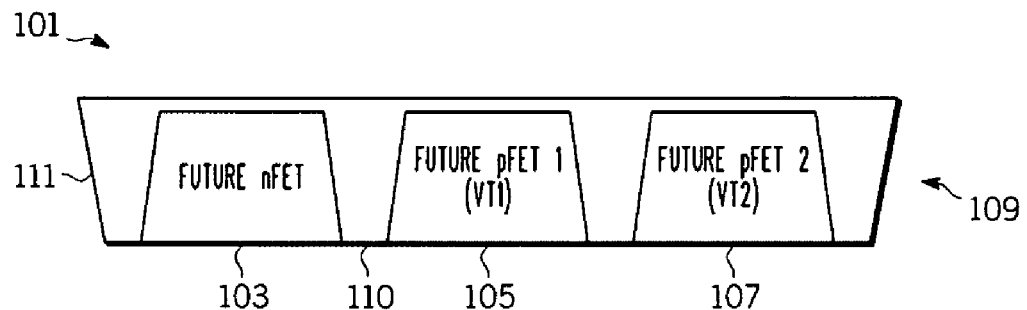
FIG. 1 is an illustration of a step in a process for making a semiconductor device in accordance with the teachings herein.

In one aspect, a method of making a semiconductor device is provided which comprises (a) providing a semiconductor substrate; (b) depositing a dielectric layer over the substrate; (c) depositing a layer of metal oxide over the dielectric layer; and (d) depositing a first layer of a first gate material over the metal oxide layer.

In another aspect, semiconductor device is provided which comprises (a) a semiconductor layer; (b) a dielectric layer; (c) first and second gate electrodes having first and second respective work functions associated therewith; and (d) a layer of hafnium oxide disposed between said dielectric layer and said first and second gate electrodes.

Despite the potential advantages of SSOI devices, these devices are also beset with certain challenges which detract from their performance characteristics. In particular, biaxially tensile strained SSOI devices often exhibit substantial shifts in flat band voltage ($V_{fb}$) due to strain-induced band offset. Some attempts have been made to compensate for this effect through increased channel doping. However, this approach is undesirable in that channel doping can lead to mobility degradation. Attempts have also been made to compensate for shifts in $V_{fb}$ through the use of metal gates placed close to the band edge. However, this approach requires n-type and p-type gates for CMOS structures. Such gates are not available for many applications and, in any event, typically require relatively complex processing.

It has now been found that the shifts in $V_{fb}$ in the nFET regions of biaxially strained CMOS devices may be overcome by disposing a layer of hafnium oxide (HfO$_2$) between the (typically polysilicon) gate electrodes and the underlying gate dielectric in those regions of the CMOS device. The layer of HfO$_2$ is found to induce Fermi level pinning of the polysilicon gate electrodes, while avoiding the need for channel doping or the provision of n-type and p-type gates. It has also been found that shifts in $V_{fb}$ in the pFET regions of biaxially strained CMOS devices may be overcome through selective condensation of Ge to convert polysilicon gates in those regions to (preferably high Ge content) SiGe gates. Such gates reduce shifts in $V_{fb}$ through Fermi level pinning.

Prior to describing the methodologies and devices disclosed herein in greater detail, a brief discussion of some of the theoretical principles underlying Fermi level pinning and the work functions of gate electrodes may be useful. Of course, it will be appreciated that, while such theoretical considerations may be useful in understanding the devices and methodologies described herein, these devices and methodologies are not limited by such theoretical considerations.

Metal/semiconductor junctions are common features in semiconductor devices. Such junctions form diodes which may be rectifying (that is, the junction tends to conduct current preferentially in one direction) or ohmic (that is, the junction has negligible resistance, regardless of the direction of current flow).

A theoretical explanation for rectification was first advanced by Schottky, who proposed that the rectifying behavior of metal/semiconductor junctions was a function of the potential barrier present at the junction. Under Schottky's model, the height of the barrier, as measured by the potential necessary for an electron to pass from the metal to the semiconductor, was taken as the difference between the work function of the metal (that is, the energy required to free an electron at the Fermi level of the metal) and the electron affinity of the semiconductor (that is, the difference between the energy of a free electron and the conduction band edge of the semiconductor). This relationship may be expressed as $$\Phi_B = \Phi_M - X_S \qquad \text{(EQUATION 1)}$$

where $\Phi_B$ is the barrier height, $\Phi_M$ is the work function of the metal, and $X_S$ is the electron affinity of the semiconductor.

In accordance with Schottky's theory, variations in barrier heights should be observable when metals of different work functions are brought into contact with the same semiconductor material. In practice, however, the barrier heights predicted by Schottky's model are seldom observed.

A subsequent model advanced by Bardeen sought to explain these differences by taking into account the role which surface states of the semiconductor play in determining Schottky barrier heights. Surface states are energy states within the bandgap between valence and conduction bands present at the edge of the semiconductor crystal. These energy states are believed to arise from incomplete covalent bonds, impurities, and other features present at the termination of the crystalline lattice of a semiconductor. For example, the silicon atoms present at the surface of a single crystal silicon wafer are not tetravalently bonded like the silicon atoms interior to the wafer, and hence contain dangling bonds that are capable of acting as charge donors or acceptors. Such termination features are believed to be responsible for surface states that trap electrical charges.

The model advanced by Bardeen assumes that surface states are sufficient to pin the Fermi level in the semiconductor at a point between the valence and conduction bands. If this were true, the barrier height at a metal-semiconductor junction would be independent of the work function of the metal. In practice, however, this condition is rarely observed, and hence Bardeen's model is generally considered instructive only as a limiting case.

While the causes underlying the Fermi level pinning of the semiconductor at a metal/semiconductor junction are still not fully understood, a model proposed more recently by Tersoff has proven useful in explaining the considerations which appear to be at play at such junctions. Tersoff's model proposes that the Fermi level of a semiconductor at a metal/semiconductor interface is pinned near an effective "gap center", which is related to the bulk semiconductor energy band structure. The pinning is due to so-called metal induced gap states (MIGS), which are energy states in the bandgap of the semiconductor that have become populated due to the proximity of the metal at the interface. Consequently, the wave functions of the electrons in the metal do not terminate abruptly at the surface of the metal, but instead decay in proportion to the distance from the metal surface. Hence, these wave functions extend into the adjacent semiconductor lattice.

In order to maintain the sum rule on the density of states in the semiconductor material, electrons near the metal surface occupy energy states in the gap derived from the valence band such that the density of states in the valence band is reduced. To maintain charge neutrality, the highest occupied state (which defines the Fermi level of the semiconductor) will then lie at the crossover point from states derived from the valence band to those derived from the conduction band. This crossover occurs at the branch point of the band structure. Although calculations of barrier heights based on Tersoff's model do not satisfy all experimentally observed barrier heights for all metal/semiconductor junctions, there is generally good agreement for a number of such junctions between empirically observed barrier heights and the barrier heights calculated on the basis of Tersoff's model.

Inhomogeneity is another source of surface effects on the aforementioned diode characteristics. That is, if factors affecting the barrier height (such as, for example, the density of surface states) vary across the plane of the junction, the resulting properties of the junction are found to be a nonlinear combination of the properties of the different regions. Hence, a conventional metal/semiconductor junction is characterized by a Schottky barrier, the properties (e.g., barrier height) of which depend on surface states, MIGS and inhomogeneities.

It will thus be appreciated from the foregoing that the Schottky barrier height at a metal/semiconductor interface is an important factor in determining the electrical properties of the junction. Thus, if one were able to control or adjust the barrier height of a metal/semiconductor junction, one could manipulate the characteristics of that junction. Without wishing to be bound by theory, it is believed that the provision of a layer of hafnium oxide in the nFET regions of biaxially strained CMOS devices overcomes the above noted issues relating to shifts in $V_{fb}$ by inducing Fermi level pinning of the polysilicon gate electrodes. Likewise, it is believed that the selective condensation of Ge to convert polysilicon gates to (preferably high Ge content) SiGe gates in the pFET regions of biaxially strained CMOS devices also overcomes shifts in $V_{fb}$ by inducing Fermi level pinning. These methodologies may be readily incorporated into a single, relatively simple fabrication process for CMOS devices, as described in greater detail below.

FIGS. 1-12 illustrate a first particular, non-limiting embodiment of a process for making a biaxially strained MOSFET device in accordance with the teachings herein. With reference to FIG. 1, a semiconductor structure 101 is provided which comprises a semiconductor layer 109 having a first portion 103 in which an nFET will be later defined, and second 105 and third 107 portions in which first and second pFETs, respectively, will be later defined. The first and second pFETs will have first and second work functions, respectively, associated with them.

The semiconductor portions 103, 105 and 107 are separated from each other by trench isolation regions 110 which have been backfilled with a suitable dielectric material 111, such as silicon oxide, silicon nitride, or silicon oxynitride. A structure of the type depicted in FIG. 1 may be formed, for example, by masking and etching the semiconductor layer 109 to define semiconductor portions 103, 105 and 107 therein, stripping the mask, depositing a layer of oxide over the structure, and planarizing the surface of the structure through chemical mechanical polishing (CMP).

Figure 2:
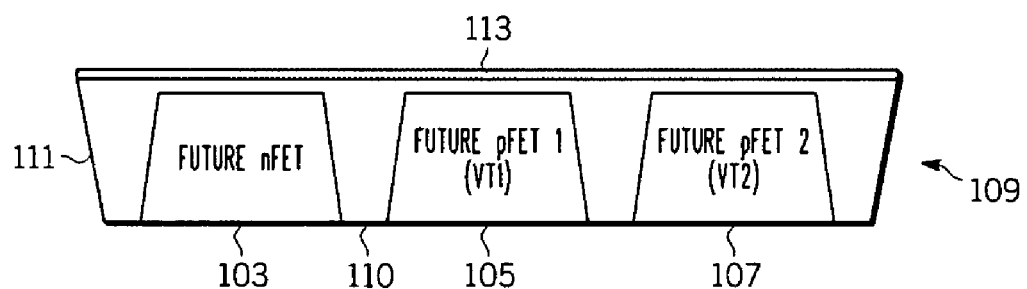
FIG. 2 is an illustration of a step in a process for making a semiconductor device in accordance with the teachings herein.

Referring now to FIG. 2, a layer of hafnium oxide 113 is deposited over the structure. The layer of hafnium oxide has a thickness within the range of about 1 Å to about 50 Å, preferably within the range of about 5 Å to about 30 Å, more preferably within the range of about 5 Å to about 20 Å, and most preferably within the range of about 10 Å to about 15 Å. While the composition of this layer is denoted at times herein as $HfO_2$, it will be appreciated that this is for convenience, and that the exact stoichiometry may vary.

The layer of hafnium oxide may be deposited using suitable chemical vapor deposition (CVD) or atomic layer deposition (ALD) techniques. Since these processes involve volatilization, the layer of hafnium oxide 113 is typically formed from a volatile precursor (such as, for example, tetrakis (diethylamino) hafnium, hafnium tetrachloride, or hafnium nitrate) which is placed in a CVD or ALD chamber, heated, vaporized (in the presence of a co-reactant such as water, if necessary), and uniformly deposited as hafnium oxide. The resulting layer of hafnium oxide 113 may have a k value of about 30, and hence is a high k dielectric. In some embodiments, the hafnium oxide may be replaced with hafnium silicate compounds such as HfSiO or HfSiON, which may be formed by a similar process through the use of suitable precursors.

Figure 3:
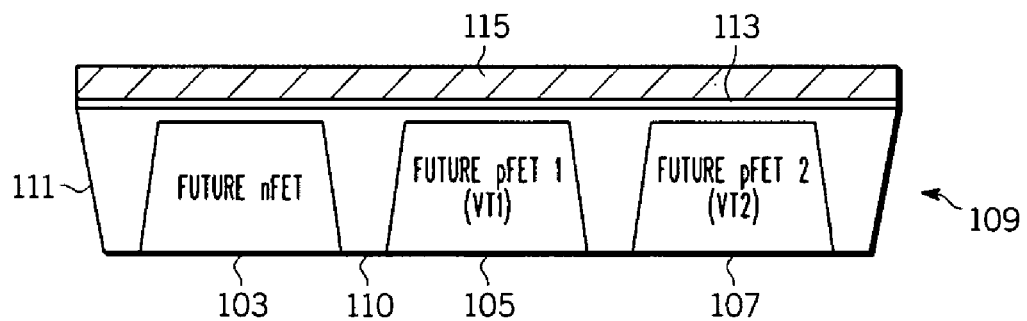
FIG. 3 is an illustration of a step in a process for making a semiconductor device in accordance with the teachings herein.

Referring now to FIG. 3, a thin layer of polysilicon gate material 115 is then deposited over the structure. Typically, the thickness of this layer is within the range of about 50 Å to about 150 Å, preferably within the range of about 70 Å to about 130 Å, more preferably within the range of about 80 Å to about 120 Å, and most preferably within the range of about 90 Å to about 110 Å. In alternate embodiments, other gate materials, such as SiC, SiGe or SiGeC, may be utilized as the gate material instead. Again, one skilled in the art will appreciate that the use of the foregoing notations is for convenience only, and is not intended as a specification of the exact stoichiometry of these materials, it being understood that the stoichiometry of these materials may vary over a considerable range.

Figure 4:
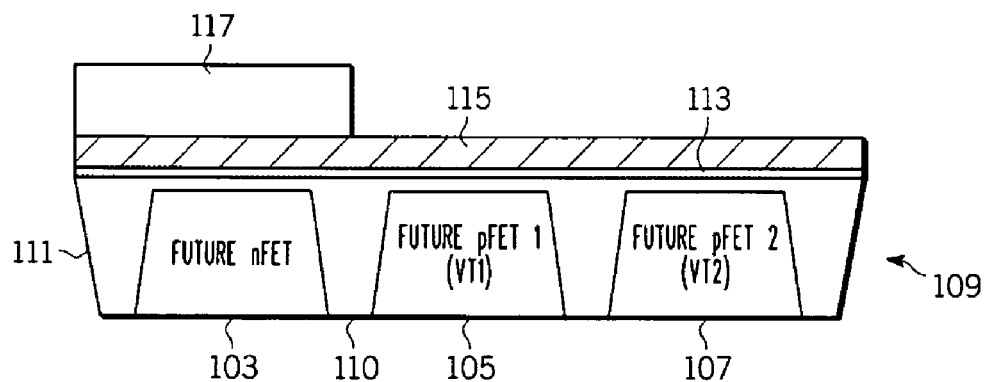
FIG. 4 is an illustration of a step in a process for making a semiconductor device in accordance with the teachings herein.

Referring now to FIG. 4, a suitable hard mask 117 is formed over the structure (typically through deposition and patterning steps) such that the portion of the gate material 115 covering the future nFET region 103 is covered, and the portion of the gate material 115 covering the future pFET regions 105, 107 is exposed. The hard mask may comprise, for example, silicon oxide or silicon nitride.

Figure 5:
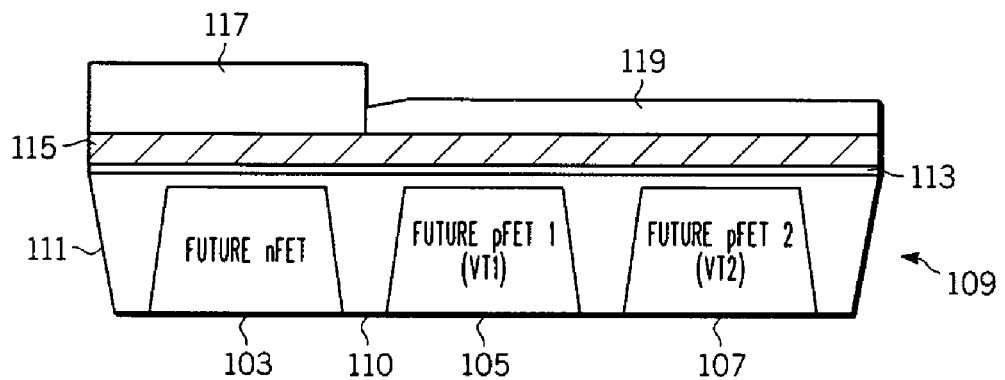
FIG. 5 is an illustration of a step in a process for making a semiconductor device in accordance with the teachings herein.

As shown in FIG. 5, the exposed portion of the polysilicon gate material 115 is then subjected to epitaxial growth using SiGe such that an SiGe layer 119 is formed thereon. Preferably, the percent by weight of Ge in the SiGe layer 119 is within the range of about 10% to about 60%, more preferably within the range of about 20% to about 50%, and most preferably within the range of about 30% to about 40%. Typically, the thickness of the SiGe layer 119 is within the range of about 50 Å to about 300 Å, preferably within the range of about 75 Å to about 225 Å, more preferably within the range of about 100 Å to about 200 Å, and most preferably within the range of about 125 Å to about 175 Å.

Figure 6:
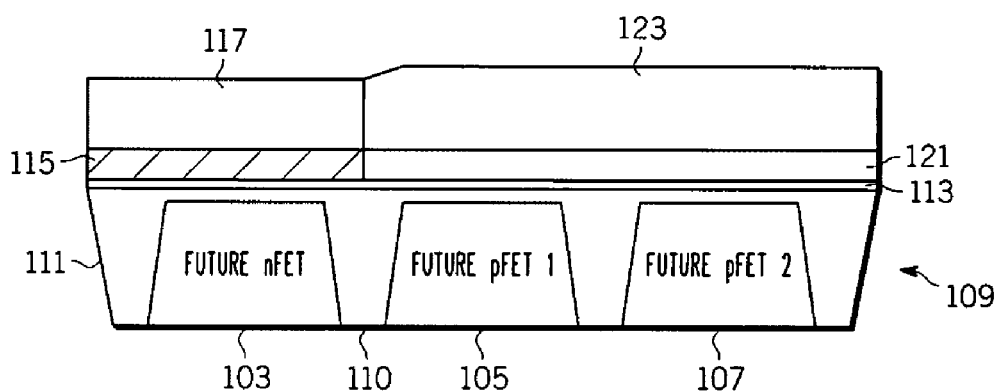
FIG. 6 is an illustration of a step in a process for making a semiconductor device in accordance with the teachings herein.

Referring now to FIG. 6, the SiGe layer 119 and the underlying polysilicon gate material 115 of FIG. 5 are subjected to a Ge condensation reaction. During this process, the structure is subjected to oxidation at high temperatures, which has the effect of pushing Ge atoms out from the SiGe layer (thus forming an oxide layer 123 in the process) and condensing the Ge atoms in the underlying portion of the polysilicon layer to form an SiGe layer 121. Hence, the interface between the original polysilicon layer 115 and the original SiGe layer 119 (see FIG. 5) disappears due to the interdiffusion of Si and Ge atoms so that, eventually, a SiGe layer 121 with a higher Ge fraction is formed on the $HfO_2$ layer 113. The Ge fraction in the SiGe layer 121 can be controlled by the oxidation time because total amount of Ge atoms in the SiGe layer 121 is conserved throughout the oxidation process. If desired, the lattice relaxation in the SiGe layer 121 may also be controlled through appropriate selection of the thickness of the epitaxially grown SiGe layer 119, thus enabling the formation of p-type and n-type strained SOI MOSFETs with enhanced mobility.

Figure 7:
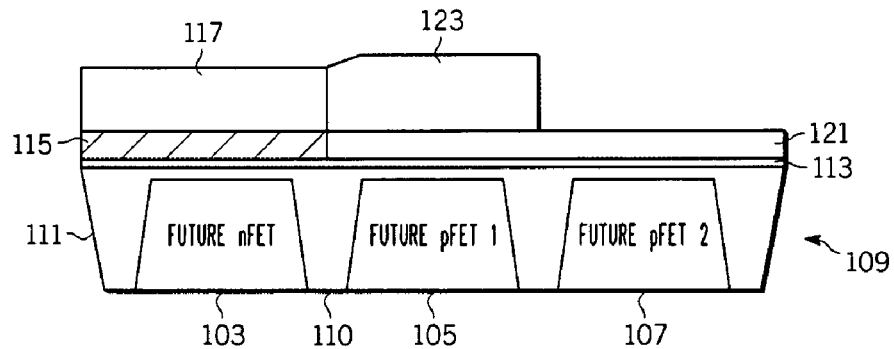
FIG. 7 is an illustration of a step in a process for making a semiconductor device in accordance with the teachings herein.
Figure 8:
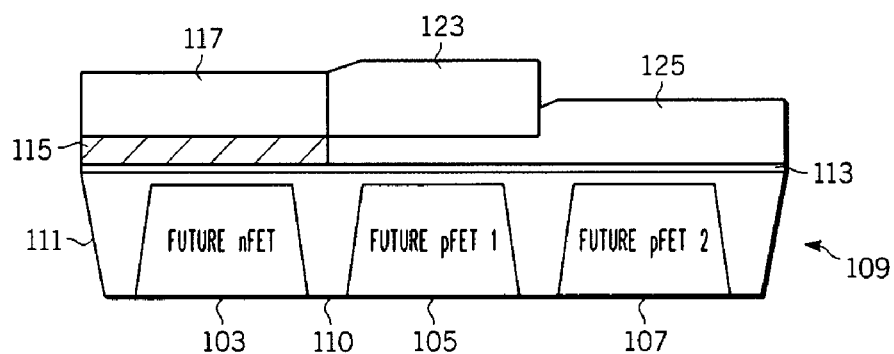
FIG. 8 is an illustration of a step in a process for making a semiconductor device in accordance with the teachings herein.

Referring now to FIG. 7, the portion of the oxide layer 123 overlying the second future pFET 107 in FIG. 6 is removed through suitable masking and etching techniques to expose the underlying SiGe layer 121. The exposed portion of the SiGe layer 121 is then subjected to epitaxial growth using SiGe as shown in FIG. 8 such that a second layer of SiGe 125 is formed. Preferably, the percent by weight of Ge in the second layer of SiGe 125 is within the range of about 10% to about 60%, more preferably within the range of about 20% to about 50%, and most preferably within the range of about 30% to about 40%. Typically, the thickness of the second layer of SiGe 125 is within the range of about 50 Å to about 300 Å, preferably within the range of about 75 to about 225 Å, more preferably within the range of about 100 to about 200 Å, and most preferably within the range of about 125 to about 175 Å.

Figure 9:
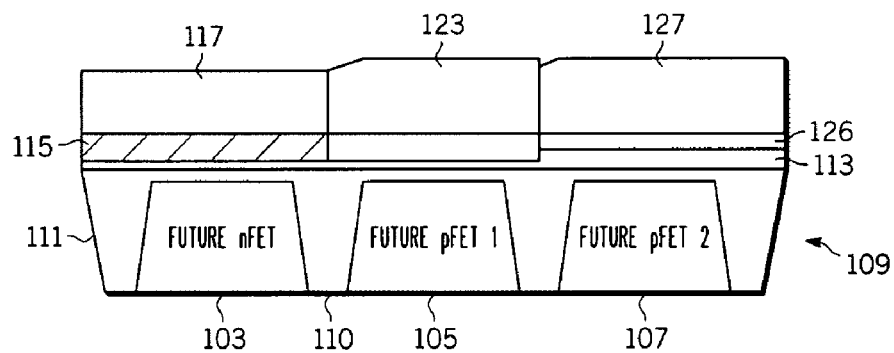
FIG. 9 is an illustration of a step in a process for making a semiconductor device in accordance with the teachings herein.

As shown in FIG. 9, the exposed portion of the second layer of SiGe 125 and the underlying SiGe layer 121 are then subjected to a Ge condensation reaction of the type described with reference to FIG. 6. This results in the formation of a layer of SiGe 126 and a layer of oxide 127 over the second future pFET 107.

Figure 10:
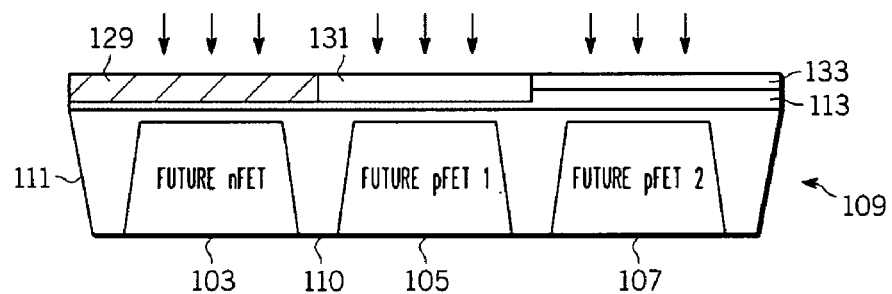
FIG. 10 is an illustration of a step in a process for making a semiconductor device in accordance with the teachings herein.

With reference to FIG. 10, the oxide layers 117, 123 and 127 of FIG. 9 are removed from the structure through a suitable etch to expose the underlying gate material. The exposed layers 129, 131 and 133 of gate material are then doped, if desired.

Figure 11:
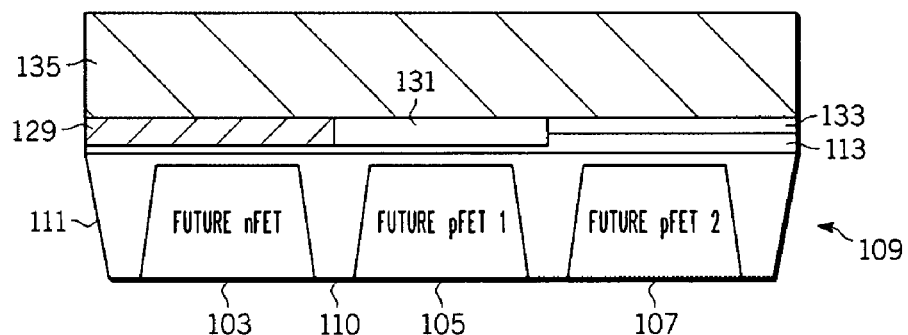
FIG. 11 is an illustration of a step in a process for making a semiconductor device in accordance with the teachings herein.

Referring now to FIG. 11, a layer of polysilicon 135 is deposited over the structure. Typically, the thickness of the layer of polysilicon 135 is within the range of about 100 Å to about 600 Å, preferably within the range of about 200 to about 500 Å, more preferably within the range of about 300 to about 400 Å, and most preferably within the range of about 325 to about 375 Å.

Figure 12:
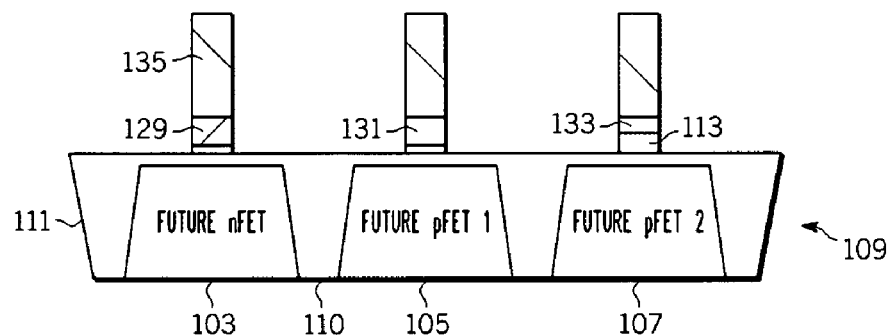
FIG. 12 is an illustration of a step in a process for making a semiconductor device in accordance with the teachings herein.

As shown in FIG. 12, the layer of polysilicon 135 and the underlying layers of gate material 129, 131 and 133 are then patterned through a suitable masking and etching process. This process may be used to define the final, or near final, dimensions of the gate electrodes of the device. Various subsequent processes as are known in the semiconductor arts may then be used to complete the CMOS device. The completed device may thus comprise spacer structures, source and drain regions, source and drain extension regions, stressor structures, silicide layers, passivation layers, electrodes, and other such features.

Figure 13:
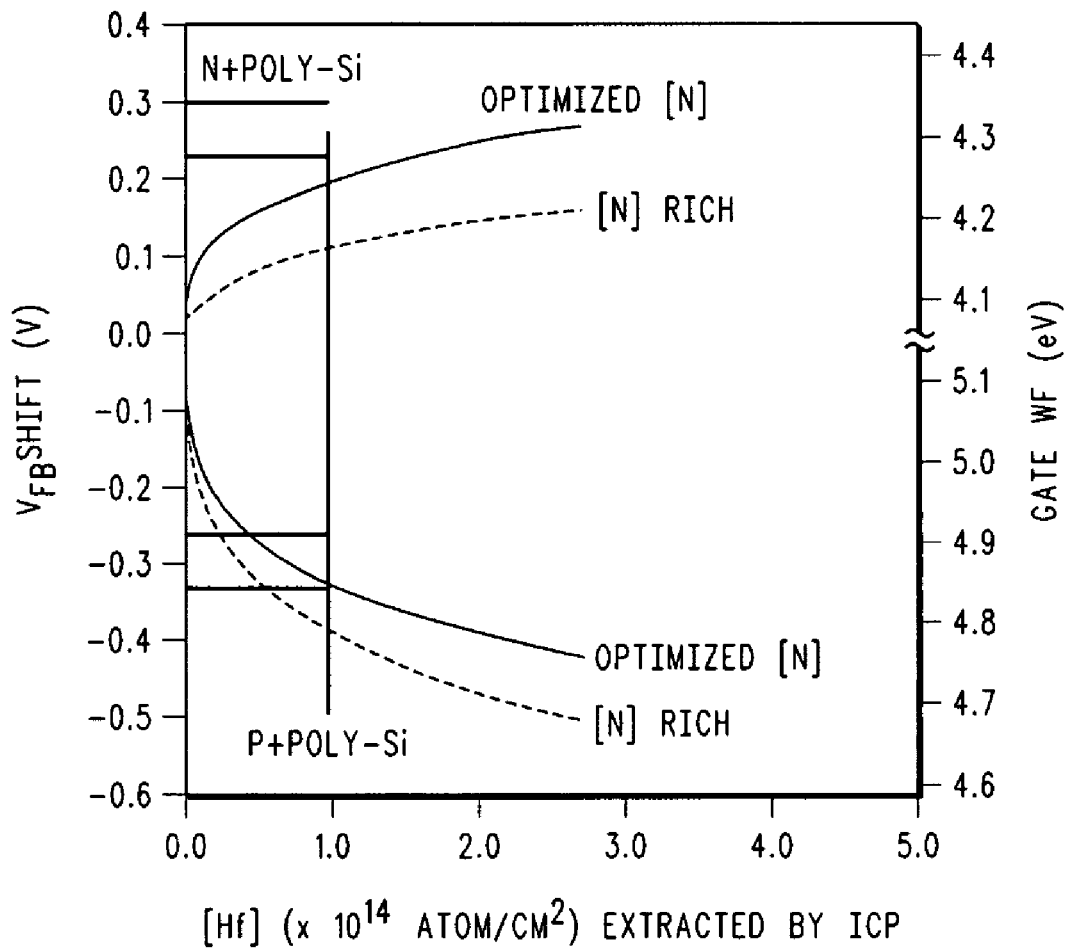
FIG. 13 is a graph of the shift in flat band voltage ($V_{FB}$) as a function of the concentration of Hf (in $10^{14}$ atom/cm$^2$) extracted by ICP.

The graph in FIG. 13 demonstrates the ability to control the work function of a polysilicon gate through the incorporation of Hf at a polysilicon/dielectric in accordance with the teachings herein. In particular, FIG. 13 is a graph of the shift in flat band voltage ($V_{FB}$) as a function of the concentration of Hf (in $10^{14}$ atom/$cm^2$) extracted by inductively coupled plasma (ICP). As seen therein, the addition of Hf at the gate electrode/gate dielectric interface causes Fermi-level pinning, with the result that the addition of more Hf raises the $V_{FB}$ of an n+ polysilicon gate, and lowers the $V_{FB}$ of a p+ polysilicon gate. It will thus be appreciated that the amount of hafnium at this interface may be utilized to adjust the work function of both types of electrodes. Moreover, the amount of nitrogen in the dielectric may be optimized such that the effects on the two gate types are essentially the same. Thus, with a concentration of Hf of $1 \times 10^{14}$ atom/$cm^2$ and a $\Delta V_{FB}$ of the nFET of 100-200 mV, the $\Delta V_{FB}$ of the pFET is −300-400 mV. With a SiGe gate of 30-40% Ge, the $\Delta V_{FB}$ of the pFET is −200-300 mV, and hence the net pFET $\Delta V_{FB}$ is about −100-200 mV.

FIG. 14 is a graph of band discontinuity (in meV) as a function of Ge fraction. The graph shows the conduction and valence band offsets in Si/Si$_{1-x}$Ge$_x$/Si heterostructures with corresponding error bars measured for Ge fractions ranging from 0.1 to 0.45. As seen therein, the Ge fraction has a negligible effect on the conduction band $\Delta V_{FB}$ of the nFET.

FIG. 15 is a graph of $V_{FB}$ as a function of the number of atomic layer deposition (ALD) cycles of HfO$_2$ on 23 Å SiO$_2$. As seen therein, the $V_{FB}$ values for p+ and n+ gates converge as the number of ALD cycles increases. Hence, this graph demonstrates that the thickness of the HfO$_2$ layer may be utilized to essentially match the work functions of the nFET and pFET devices.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method of making a semiconductor device, comprising:
    providing a semiconductor substrate;
    depositing a dielectric layer over the substrate;
    depositing a layer of metal oxide over the dielectric layer; and
    depositing a first layer of a first gate material over the metal oxide layer;
    forming a hard mask over the first layer of the first gate material, thereby creating a covered portion and an exposed portion of the first layer; and
    epitaxially growing the exposed portion of the first layer.

2. The method of claim 1, further comprising:
    forming a gate electrode from the first layer of the first gate material.

3. The method of claim 1, wherein the metal oxide layer comprises hafnium oxide.

4. The method of claim 1, wherein the first gate material is a semiconductor material.

5. The method of claim 1, further comprising:
    forming a hard mask over the first layer of the first gate material, thereby creating a covered portion and an exposed portion of the first layer; and
    epitaxially growing the exposed portion of the first layer.

6. The method of claim 5, wherein the first gate material is polysilicon, and wherein the exposed portion of the first layer is epitaxially grown by exposing it to an atmosphere comprising SiGe.

7. The method of claim 5, further comprising:
    subjecting the epitaxially grown first layer to oxidation, thereby forming a second layer of gate material covered by a first layer of oxide.

8. The method of claim 7, wherein the first gate material is polysilicon, wherein the exposed portion of the first layer is epitaxially grown by exposing it to an atmosphere comprising SiGe, and wherein the oxidation of the epitaxially grown first layer induces Ge condensation within the epitaxially grown first layer.

9. The method of claim 8, wherein the Ge condensation results in the formation of the second layer of gate material and the first layer of oxide.

10. The method of claim 7, further comprising:
    selectively removing a portion of the first layer of oxide, thereby creating a covered portion and an exposed portion of the second layer of gate material.

11. The method of claim 10, further comprising:
    epitaxially growing the exposed portion of the second layer of gate material.

12. The method of claim 11, further comprising:
    subjecting the epitaxially grown second layer of gate material to oxidation, thereby forming a third layer of gate material covered by a second layer of oxide.

13. The method of claim 12, further comprising:
    exposing the first, second and third layers of gate material; and
    doping the first, second and third layers of gate material.

14. The method of claim 13, further comprising:
    forming a layer of polysilicon over the first, second and third layers of gate material.

15. The method of claim 14, wherein the first, second and third layers of gate material have first, second and third distinct compositions.

16. The method of claim 15, wherein each of the first, second and third layers of gate material comprise SiGe, and wherein the percent by weight of germanium in each of the first, second and third layers of gate material is different.

17. The method of claim 12, further comprising forming first and second gate electrodes out of the second and third gate materials, respectively, and wherein the first and second gate electrodes have first and second respective work functions associated therewith.

18. The method of claim 17, wherein the first and second work functions are distinct.

19. The method of claim 1, wherein the semiconductor device is an SSOI device.

* * * * *